United States Patent [19]

Beatty

[11] Patent Number: 5,028,452
[45] Date of Patent: Jul. 2, 1991

[54] CLOSED LOOP SYSTEM AND PROCESS FOR CONVERSION OF GASEOUS OR VAPORIZABLE ORGANIC AND/OR ORGANO-METALLIC COMPOUNDS TO INERT SOLID MATRIX RESISTANT TO SOLVENT EXTRACTION

[75] Inventor: Charles L. Beatty, Gainesville, Fla.

[73] Assignee: Creative Systems Engineering, Inc., Boca Raton, Fla.

[21] Appl. No.: 407,868

[22] Filed: Sep. 15, 1989

[51] Int. Cl.$^5$ .............................. B05D 3/06; B05D 7/00
[52] U.S. Cl. ........................................ 427/41; 427/39; 427/212; 427/213; 423/DIG. 20
[58] Field of Search .................... 427/39, 41, 212, 213; 588/208, 209, 212, 215, 221, 224, 227, 230; 118/716, 719, 722, 723, DIG. 5

[56] References Cited

U.S. PATENT DOCUMENTS

| | | | |
|---|---|---|---|
| 4,479,443 | 10/1984 | Faldt et al. | 588/212 |
| 4,644,877 | 2/1987 | Barton et al. | 588/212 |
| 4,717,585 | 1/1988 | Ishihara et al. | 427/39 |
| 4,735,633 | 4/1988 | Chiu | 427/39 |

Primary Examiner—Shrive Beck
Assistant Examiner—Marianne Padgett
Attorney, Agent, or Firm—John H. Faro

[57] ABSTRACT

Closed system and process for the conversion of gaseous or vaporizable organic and/or organo-metallic compound to inert solid which is resistant to solvent extraction, and is itself essentially nontoxic or convertible through oxidation or other natural processes to a toxic material. This process involves a low temperature, low energy conversion in a close system, of an organic and/or organo-metallic material by initially fragmenting such material into its basic elements follow thereafter by randomly recombining such elements as a solid coating or deposit upon a substrate. In the preferred embodiments of this invention, the toxic and/or potentially toxic material is injected as a gaseous phase into a chamber where it is subjected to an RF energy source, thereby forming a plasma which is contained within the chamber by a magnetic field. The chamber, as well as, the other components of the conversion system are maintained under a negative pressure which allows for the transport of the plasma throughout the system to a second chamber where the elements of the plasma can recombine in a random fashion. The recombination of these elements as a solid allows for ease of handling and prevents their release into the atmosphere or ground water. Compounds which can be subjected to this process include chlorinatehydrocarbons i.e., methylenechloride, carbontetrachloride and chlorofluorocarbons (i.e., Freons).

16 Claims, 2 Drawing Sheets

CLOSED LOOP SYSTEM AND PROCESS FOR CONVERSION OF GASEOUS OR VAPORIZABLE ORGANIC AND/OR ORGANO-METALLIC COMPOUNDS TO INERT SOLID MATRIX RESISTANT TO SOLVENT EXTRACTION

BACKGROUND OF THE INVENTION

1. Field of the Invention

This invention relates to an apparatus and to a process. More specifically, this invention is directed to a system and a process for conveting gaseous or vaporizable toxic, and potentially toxic, organic compounds, organo-metallic compounds, mixtures of organic compounds; mixtures of organo-metallic compounds; mixtures of organic and organo-metallic compounds, to an inert, cross-linked solid matrix, that is essentially impervious to solvent extraction. This invention has also potential application in converting gaseous or vaporizable materials to products which are useful as articles of commerce and/or which can provide enhancements to articles of commerce; the specific utility of such materials, of course, being dependent upon the chemical components thereof, and upon the medium to which these components are allowed to condense and/or recombine, and the physical properties of the resultant deposit.

2. Description of the Prior Art

It need not be belabored, that industrial wastes have and continue to pose not only a threat to water and air quality, but also that the means for safe disposal are, indeed, quite limited—in the sense that a number of options available a few years ago will not be available in the future. More specifically, the land fills and containment storage facilities for disposing of these materials have only a finite capacity. The option of incineration is recognized as no longer available because of the formation of secondary pollutants (i.e. oxides of sulphur, carbon dioxide and carbon monoxide, oxides of nitrogen, etc.). Similar disposal problems have been and continue to present themselves in the non-industrial environment. More specifically, many materials presently in commerce, which were originally regarded as innocuous, are now known to pose serious health risks and their withdrawal from the marketplace, if not presently required, is to be mandated in the future. Two examples which immediately come to mind, include the electric power industry's use of polychlorobiphenyls (PCB's) in transformers; and, the imminent withdrawal of chlorofluorocarbons as a refrigerant. The disposal of PCB's generally involves (incineration). The effective recovery and disposal of chlorofluorocarbons has yet to be addressed. Because of the effect of these latter materials on the atmosphere, their continued use in commerce is scheduled for withdrawal in the immediate future. The more troublesome problem has, and will continue to be, their safe disposal.

With the increase in sensitivity and awareness of the public and the regulatory agencies, charged with responsibilities for maintaining environmental quality, the safe disposal of hazardous and potentially hazardous materials has come under increasing scrutiny. Moreover, because a number of materials in commerce (initially thought to be innocuous) will also be prohibited from future use, and their withdrawal from commerce mandated as a safer replacement/alternative is identified, the regulatory environment has and will continue to be increasingly critical of the methods for safe disposal, and the effect thereof upon the environment, particularly with regard to the generation of secondary pollutants. Unfortunately, the difficult decisions to withdraw a product, and/or recall/recover that which is already in commerce, are often dictated by the magnitude of the problem, and, thus, the cost of the safe disposal effort of the offending agent.

In summary, the preferred solution to safe and effective waste disposal of toxic agents and potentially toxic agents generated incident to manufacture, is to minimize or eliminate their generation, or, alternatively, somehow dispose of them at the source of generation. The advantage of the latter solution is clear. More specifically, a "site of generation" disposal system will retain continuity of responsibility and accountability of the manufacturer; eliminate the cost of transporting such materials (with the hazards inherent in such transport), and under certain circumstances, will permit potential recovery and/or utilization of such waste products in the manner which would offset, at least to a degree, their disposal cost.

Similar conditions and needs exist with materials presently in commerce-the need for retrieval and safe disposal thereof. The recovery and containment of these materials, and the problems associated therewith increase dramatically where the offending substance is unstable at ambient temperature, is a gas or changes from a liquid to a gas at ambient temperature. The control over recovery of these types of substances is most troublesome, since it may be difficult, if not impossible, to detect their release into the atmosphere where the sources of such offending substances are diffuse and the amount of substances released at a particular instance is relatively small, as in the case of chlorofluorocarbon-type refrigerants.

As is thus evident from the above discussion, a continuing need exists for an effective means for disposal of industrial waste and other offending substances presently in commerce. The means for such disposal must not only be effective, it must preferably lend itself to "on-site" treatment at the source of generation and will, in certain instances, permit reclamation of the offending substances in a manner which will offset at least a portion of the cost of their disposal. In order to be cost effective and competitive with other disposal means, the means selected for disposal of offending manufactured waste must also be able to accommodate both "defined" as well as "ill-defined" (mixed) waste streams. In addition, the preferred means of disposal must be relatively energy efficient and avoid the cogeneration of bi-products of the disposal effort which are themselves undesirable (i.e. sulphur dioxide, oxides of nitrogen, carbon dioxide, carbon monoxide, etc.) or are themselves toxic or potentially toxic. To the extent that the waste stream is incapable of reclamation, the product of the disposal effort must itself be inert, easy to handle (i.e. a solid) and relatively impervious to solvent extraction, thus, being capable of discard in a sanitary landfill without concern for contamination of ground water, or fear that the exposure thereof to wildlife and human contact will cause additional health problems. For a process of this type to receive general acceptance, the means for disposal must at a minimum be capable of handling the vast majority of organic or organo-metallic compounds which form the bulk of the waste disposal problems.

OBJECTS OF THE INVENTION

It is the above and related objects of this invention to remedy the above as well as related deficiencies in the prior art.

More specifically, it is the principal object of this invention to provide a system and process for the converting a toxic or potentially toxic gas or vaporizable organic or organo-metallic substance to an inert solid, which is essentially imprevious to solvent extraction.

It is another object of this invention to provide a system and process which lends itself to adaptation for conversion of a waste stream of a toxic or potentially toxic gas or vaporizable organic or organo-metallic substance, at the source of generation, thereby eliminating the need for containerization and shipping, and the attendant expenses associated therewith.

It is yet another object of this invention to provide a system and process for converting a toxic and potentially toxic gas or vaporizable organic or organo-metallic substances in a manner which permits reclamation of one or more components of the offending substance in a form which is essentially inert, solid form and which is essentially impervious to solvent extraction.

It is still yet another object of this invention to provide a system and process for converting a gas or toxic or potentially toxic gaseous, organic or organo-metallic substances to an inert solid mass or coating which is essentially impervious to solvent extraction.

It is a further object of this invention to provide a system and process for converting a gas or a toxic or potentially toxic vaporizable organic or organo-metallic substance in a defined or ill-defined (mixed) waste stream.

It is yet a further object of this invention to provide a system and process for converting a gas or a toxic or potentially toxic vaporizable or organo-metallic substance to an inner solid mass or coating without cogeneration of any undesirable bi-products associated with the conversion process.

It is still yet a further object of this invention to provide a system and method for converting a toxic or potentially toxic vaporizable substances which accomplishes such conversion in a manner consistent with continuous operation.

SUMMARY OF THE INVENTION

The above and related objects are achieved by providing a reactor system and a process for converting a gas or a vaporizable toxic and potentially toxic organic or organo-metallic materials to a highly cross-linked, inert, solid matrix that is both resistant to leaching by solvents and is itself non-toxic. More specifically, this invention provides a unique reactor system and process for converting a defined and/or ill-defined (mixed) waste stream of toxic materials, by initially fragmenting such materials by disruption of the chemical bonds in a high energy density electric field to form a plasma comprising free radicals, ions and electrons; and, the generation of electromagnetic radiation in the ultra-violet and near ultra-violet region of the electromagnetic spectrum. The frequency and density of the electric field, the field intensity (power) and residence time of the materials within the electric field are consciously selected to effect essentially complete disruption of the chemical bonding of such materials and, thus, molecular fragmentation thereof into a reactive plasma. In order to inhibit the reactive components of the plasma from recombining and indiscriminate deposition upon the interior surface of the plasma-generating chamber of the reactor, a magnetic field is applied to the plasma; the strength and location of the magnetic field being effective to maintain/confine the plasma within a prescribed region of the plasma-generating chamber and remote from the surface of the walls of the deposition chamber; until such time as the plasma is transported to a deposition chamber within the reactor where the reactive components thereof can recombine and form a particulate mass, or as a coating, in the form of a highly cross-linked solid matrix. This process has application for converting a defined and/or an ill-defined (mixed) stream of a gas or a vaporizable organic and/or organo-metallic materials of the type which are typically found and/or produced in dry-cleaning facilities; (i.e. chlorinated solvents-trichlorlethylene); in the manufacture of printed circuit boards and micro-electronic devices (i.e. methylene chloride and organo functional silanes; paint manufacture (i.e. benzene, toluene and xylene). This process also has application for the disposal of particularly troublesome chemicals such as PCB's (polychlorinated biphenyls) and chlorofluorocarbons; pesticides and phytotoxins (i.e. aromatic amines).

The advantages of this novel process over the more traditional disposal methods for waste material treatment include operation of the conversion process within a closed system; low power demands; no cogeneration of undesirable by-products (i.e. sulphur dioxide, carbon dioxide, carbon monoxide, oxides of nitrogen); the ability to effect such conversion of an ill-defined (mixed) stream of toxic materials; and the conversion of the offending substance to an inert highly cross-linked solid particulate mass or coating.

The apparatus used in the implementation in the process of this invention is relatively inexpensive, when compared to the alternative disposal options and can be operated without extensive supervision; can be operated at the source of generation of the vaporizable waste material, either as an integral step in the manufacturing cycle or simply trucked to the source of the vaporizable toxic waste materials where it can be operated as needed and then moved on to yet another site.

In the preferred embodiments of this invention, the process parameters can be tuned or optimized for a specific waste stream having predefined compositional characteristics. For example, it is appreciated that the optimum frequency of electric energy power source for generation of the plasma will be determined by the optimum absorption characteristics of the components of the waste stream. Such optimum frequency can be readily empirically determined by monitoring the speed and completeness of the conversion/deposition and/or by the physical characteristics of the inert, cross-linked matrix which is formed upon recombination of the components of the plasma. In the context of the present invention, such optimum frequency is in the range of from about 100 megahertz to 2.5 gigahertz.

In another of the preferred embodiments of this invention, the recombination of the components of the plasma is directed to a product or coating which is itself an article of commerce, or provides enhancement to an article of commerce.

DESCRIPTION OF THE INVENTION INCLUDING PREFERRED EMBODIMENTS

Figure 1:
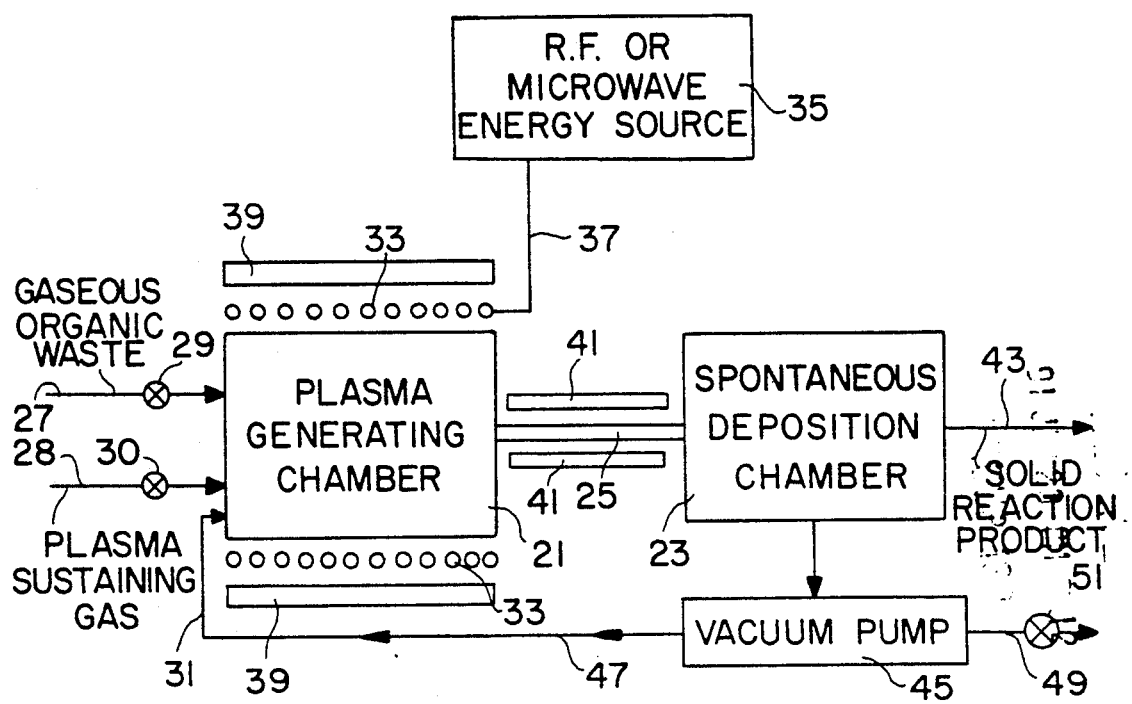
FIG. 1 is a block diagram representing schematically an apparatus for practicing the conversion process of this invention.

Preliminary to a discussion of the preferred embodiments of the system and process of this invention, it is important to first focus upon and appreciate that it is neither the intent nor purpose of this application to represent that glow discharge or plasma polymerization is unique to the invention described herein. Quite the contrary, glow discharge or plasma polymerization of monomers to form highly cross-linked fibers and coatings is well-known in the prior art, U.S. Pat. Nos. 4,557,946 (to Sacher et al); 4,744,860 (to Cop et al); 4,737,379 (to Hudgens et al); and 4,795,529 (to Kawasaki et al) being representative, but by no means exhaustive, of this polymerization technique. In brief, these patents describe specific applications of glow discharge or plasma polymerization of monomers to accomplish specific objectives.

More specifically, U.S. Pat. No. 4,557,946 describes the use of microwave energy to effect the glow discharge polymerization of organofunctional silicones upon a substrate to enhance the water impermeability of the treated substrate.

U.S. Pat. No. 4,737,379 describes the use of plasma enhanced chemical vapor deposition (also referred to by the inventors as "glow discharge deposition") to deposit hydrogen-free fiber/coatings upon amorphous alloy films having a predefined fluorine content. The preferred energy source for generation of the plasma is a microwave energy generator. The discussion of the prior art in the '379 patent is quite extensive and to the extent applicable to an appreciation of plasma-enhanced chemical vapor deposition, it is herein incorporated by reference.

U.S. Pat. No. 4,744,860 describes surface treatment of synthetic polymeric fibers with a low temperature microwave plasma to enhance the fiber surface to coloration with an acid dye. The preferred surface treatment involves integrating reactive N-H groups onto the nonpolar surface of the fiber thereby enhancing its interaction with an acidic dyestuff.

U.S. Pat. No. 4,795,529 describes an apparatus and process for plasma surface modification of a substrate by alternately etching and depositing material on the surface of a silicone wafer.

In the context of this invention, glow discharge or plasma polymerization is adapted to achieve an essentially complete conversion of a feed stream containing a toxic or potentially toxic agent in a manner consistent with its transformation to an inert solid that can be safely disposed of without concern of it contaminating the environment. This process contemplates essentially complete conversion of the feed stream within a closed system, and, the trapping and/or recycling of any unconverted material of feed stream, to prevent release into the atmosphere. In addition, this process contemplates containment of all products of the conversion within the resultant solid attained upon completion of such conversion, thus, avoidances of generation of offending substances, notably oxides of nitrogen, carbon dioxide, carbon monoxide, and/or oxides of sulfur, which detract from environmental quality.

In the context of this invention, the term "toxic" and the phrase "potentially toxic" are used to characterize or describe the substance which is converted in accordance with the process of this invention from an environmentally threatening agent to an inert particulate or coating. A substance is regarded as environmentally threatening if it is capable of directly inducing physiological, and/or biological changes in plant or animal life; or indirectly inducing physiological and/or biological changes in plant or animal life by alteration in climate and/or other factors which influence the normal physiological and/or biological processes.

In one of the preferred embodiments of this invention a feed stream containing one or more toxic or potentially toxic agents is introduced as a vapor into a plasma-generating chamber at reduced pressure. The temperature of vaporization of the feed stream will, thus, vary depending upon the specific materials contained therein. This vapor is subjected to a high energy density electric field at a power level and frequency selected for efficient disruption of the chemical bonds of the vapor and thereby reduce the constituents thereof to a plasma comprising free radicals, ions, electrons, accompanied by the generation of electromagnetic radiation in the ultraviolet and near ultraviolet region of the electromagnetic spectrum. Because of the reactivity of the components of the plasma, there is a strong tendency to recombine and deposit upon the surface of the reactor walls. In order to prevent uncontrolled recombinations and deposition of such reactive species, a magnetic field is imposed upon the plasma to prevent indiscriminate deposition. Such control of indiscriminate deposition of the plasma is not only maintained while the plasma is within the confines of the plasma-generating chamber but also as it is transported by vacuum from this plasma-generating chamber to one or more thus functionally distinct deposition chambers within the reactor. As noted previously herein, the feed stream may be a gas (i.e. chlorofluorocarbon) and, thus, can be introduced directly into the plasma-generating chamber without prior heating.

In one of the preferred alternative embodiments of this invention, the reactor of the system of this invention comprises a plurality of plasma generators, arranged in series relative to one another. Each of these plasma generators can be separately "tuned" (through selection of appropriate power setting and frequency), to effect fragmentation of the distinctive chemical species which are present in a common-feed stream. In another of the preferred embodiments of this invention, the reactor is designed for essentially continuous operation.

The block diagram shown in FIG. 1 represents, in general terms, a novel apparatus for practicing the novel process of this invention. The apparatus is a reactor comprising a first chamber (21) for generating a plasma, a second chamber (23) for producing and depositing a solid, insoluble reaction product from the plasma, and a plasma conduit (25) therebetween. The first plasma-generating chamber (21) may be a glass or a glass-lined cylindrical tube with the conduit (25) connected at its output end, and one or more inlets (27 and 28) connected at its input end, each inlet having a separate input control valve (29 and 30). There is also a return inlet (31) for recycling gases from the second chamber (23). As shown in FIG. 1, there is an inlet (27) for gaseous organic waste and an inlet (28) for an auxiliary gas which may be desired for producing and/or sustaining a plasma in the first chamber (21).

A high-energy input coil (33) is positioned around the first chamber (21), and a source of RF (radio frequency) is connected to the coil (33) through an electrical lead (37) to effect inductive coupling of said RF source to said first chamber. With a gas or mixture of gases in the first chamber (21), energy from the coil (33) converts the gases to a plasma of ions and molecular fragments which are highly reactive. To prevent reaction with, and/or deposition of material on, the inner surfaces of the walls of the first chamber (21) there is provided suitable first magnetic fields from first magnet (39) for compressing the plasma in the first chamber (21) and maintaining the plasma at a distance from the walls of the first chamber (21).

The compressed plasma passes to the second deposition chamber (23) under the influence of the magnetic fields that are present and due to a lower pressure in second chamber (23). The absolute pressures in the first and second chambers (21 and 23) are in the range of 10 to 300 microns, preferably 50 to 200 microns. To prevent reaction with, and/or deposition of material on, the inner surfaces of the walls of the conduit (25), there is provided suitable second magnetic fields from second magnets (41) for compressing the plasma passing through the conduit (25). The second magnetic fields may also aid on driving the plasma through the conduit (25).

The second deposition chamber (23) provides an environment in which the constituents of the plasma, introduced through the conduit (25), can combine to form a solid, insoluble reaction product. For this reason, any electric and/or magnetic fields that are induced should be to aid the deposition of reaction products. The second chamber (23) provides available sites for the deposition of the reaction product. These deposition sites may be located on the walls of the second chamber itself, or on the surfaces of particles, or on extended surfaces present in the chamber. In one embodiment, the deposition sites are on the particles in a bed that is kept fluidized by a vibrating support screen. In another embodiment, the deposition sites are on particles that are falling through the second chamber (23). In each of the embodiments of this invention, the plasma condensate which forms in the deposition chamber is a solid, insoluble reaction product shown by the arrow (43). The second chamber (23) is so constructed that the reaction product and the surfaces on which it is supported can be removed periodically. In one embodiment, there are two or more second chambers (23) so arranged, that one second chamber can be removed and replaced while another second chamber is being filled.

The apparatus shown in FIG. 1 includes a vacuum pump (45), or other gas pumping arrangement, which is connected to the second deposition chamber (23), yet pressurizes the entire apparatus. There may be several vacuum pumps which may be connected at several locations on the apparatus in order to maintain the desired gas pressure levels, to speed the pumping of gases, and to achieve better process control. The output gas from each of the vacuum pumps (45), which may contain noxious or otherwise undesirable gases, is connected by a return duct (47) to the first chamber (21) through the return inlet (31). Any accumulation of non-reactive gas in the apparatus can be released periodically to the atmosphere through a vent (49) on the vacuum pump (45) by opening the vent valve (51).

Figure 2:
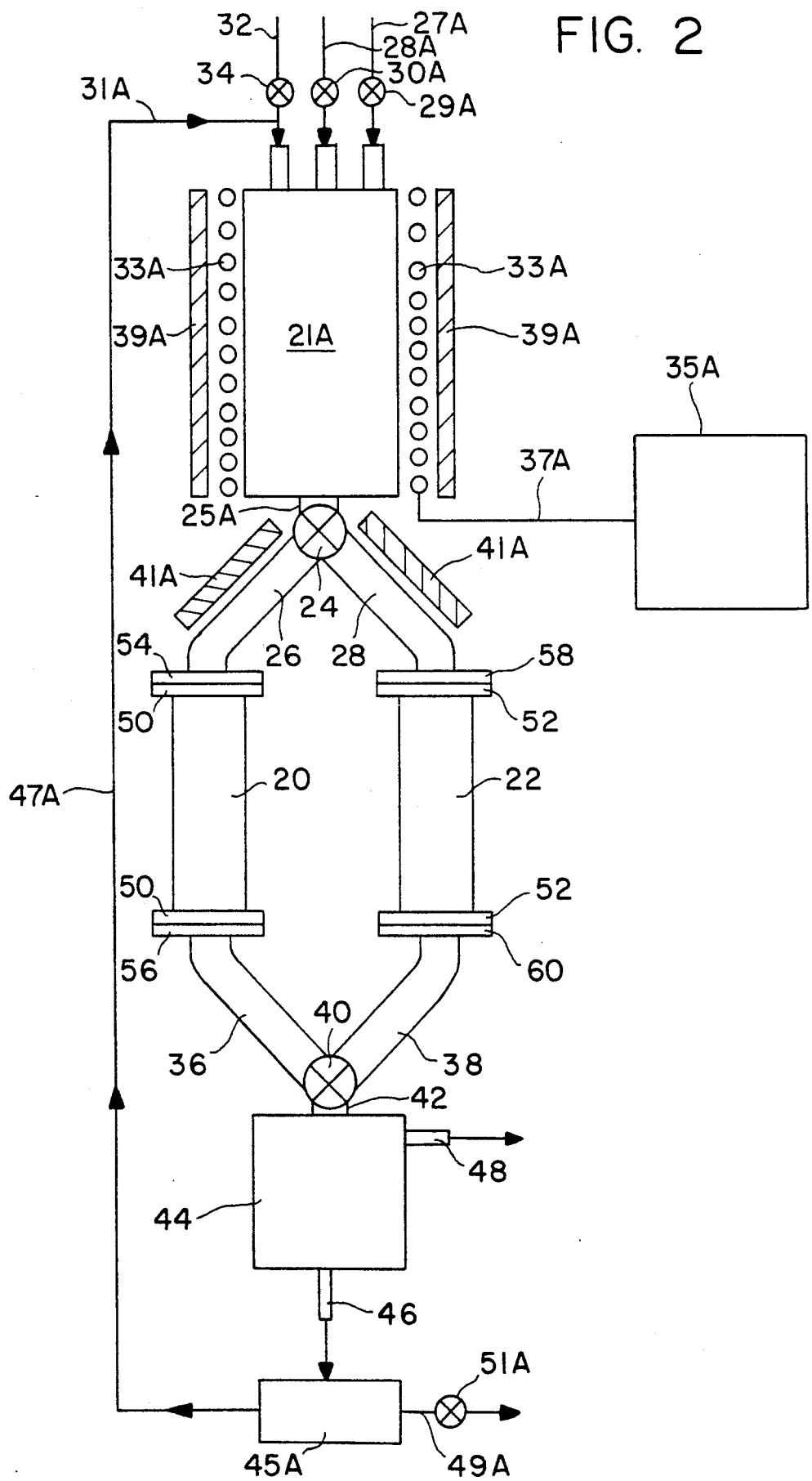
FIG. 2 is an elevational, partially-schematic view of an apparatus which can be used in the novel conversion process wherein the solid reaction product deposits in a tubular plasma condensation/deposition chamber.

The first embodiment of the novel apparatus shown in FIG. 2 is shown to have a general downward vertical flow of gases and plasma, and has two (or more) removable second deposition chambers. Structures which are similar to those already described with respect to FIG. 1 bear the same reference numeral followed by the letter "A".

The first embodiment includes a cylindrical glass first chamber (21A) having first, second and third inlets (27A, 28A and 32) at its input end, each inlet having a first, second and third inlet control valve (29A, 30A and 34) respectively. A return inlet (31A) is connected to the third inlet (32) at the discharge side of the third inlet control valve (34). A high-energy input coil (33A) is positioned around the first chamber (21A) and a source (35A) of RF energy is connected to the coil (33A) through an electrical lead (37A).

The plasma conduit (25A) connects the output end of the first chamber (21A) to a first three-way valve (24) which permits plasma to flow from the conduit (25A) into a left inlet branch (26), or a right inlet branch (28), or stop the flow of plasma entirely. The first chamber (21A) has first magnetic means (39A) to prevent the deposition of solid material on the interior surfaces thereof as described above. The conduit (25A), the three-way valve (24), and the first and second inlet branches (26 and 28) have second magnetic means, shown symbolically by the magnets (41A), to prevent the deposition of solid material on the interior surfaces thereof.

A left second chamber (20) is detachably connected at one end to the left inlet branch (26) and a right second chamber is detachably connected at one end to the right inlet branch (28). The other ends of the left and right second chambers (20 and 22) are detachably connected to left and right outlet branches (36 and 38) respectively, which outlet branches (36 and 38) join together at the second three-way valve (40) having a discharge nipple (42). The discharge nipple (42) connects to a trap (44), which is exhausted continuously of gases through an exhaust duct (46) by a vacuum pump (45A). The vacuum pump (45A) discharges to a return duct (47A) and/or a vent (49). The trap (44) has an overflow duct (48).

The left and right second chambers (20 and 22) are generally cylindrical glass tubes which have integral glass end flanges (50 and 52) respectively that are ground flat, and which match corresponding flat ground glass end flanges (54 and 56) on the first inlet and outlet branches (26 and 36), and glass end flanges 58 and 60) on the second inlet and outlet branches (28 and 38) respectively. Each of the second chambers (20 and 22) may be replaced by sliding the chamber out along the ground faces of their respective flanges, and sliding another second chamber in along those ground surfaces. The facing ground surfaces of the flanges may be hermetically sealed with a silicone jelly or other sealing galase as is known in the art. Any other removable construction and sealing made may be used in place of the above-described construction.

In operation, the three-way valves (24 and 40) are positioned to provide an open passage from the first chamber (21A) through one of the second chambers, for instance, the left second chamber (20), to the trap (44), and with the vent valve (51A) open. The entire apparatus is pumped down with the vacuum pump (45A) to a desired level below 0.001 Torr, and then the vent valve (51A) is closed. Pumping with the vacuum pump is continued and RF energy from the source (35A energizes the core (33A) at about 2.45 Gigahertz. Then, the desired mix of gases is introduced into the first chamber (21) through one or more of the inlets (27A, 28A and 32). The interaction of the RF energy with the introduced gases forms a plasma in the first chamber (21A), while the vacuum pump maintains a pressure of about 50 to 200 microns, the plasma passes from the first chamber (21A) through the left inlet branch (26) to the left second chamber (20) where the constituents of the plasma combine to form a solid reaction product which deposits on the walls of the left second chamber (20). When the left second chamber (20) is filled with reaction product, the three-way valves (24 and 40) may be repositioned to provide an open passage from the first chamber (21A) through the right second chamber (22) to the trap (44). The left second chamber (20) may then be removed (while the novel process continues through the right second chamber (22) and replaced with another empty left second chamber (20). The right second chamber (22) may be replaced by a similar procedure, and each second chamber (20 and 22) may be replaced as many times as desired.

Figure 3:
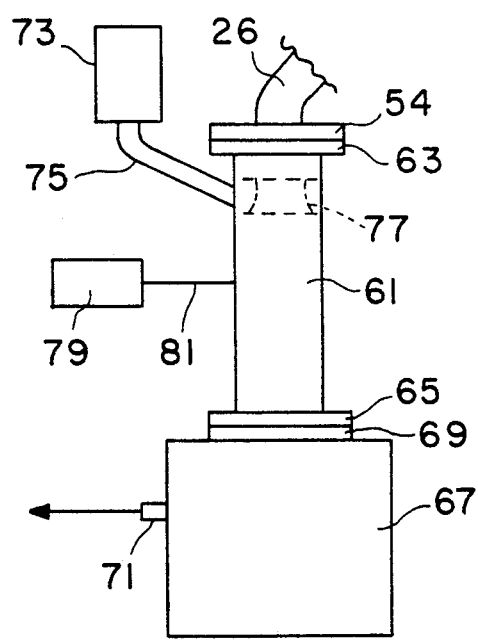
FIG. 3 is an elevational view of a first alternative plasma condensation/deposition chamber for the apparatus of FIG. 2 wherein the solid reaction product deposits on falling particles.

FIG. 3 illustrates an alternative left second deposition chamber (61) that may be connected to the end flange (54) of the left inlet branch (26) of the apparatus shown in FIG. 2. A similar right second chamber (not shown) may be attached to the end flange (58) of the right inlet branch (28). In this alternative structure, the solid reaction product deposits on cascading particles that are introduced in the second chamber (61) form a storage container (73).

The alternative structure shown in FIG. 3 comprises a hollow cylindrical left second chamber (61) having upper and lower end flanges (63 and 65), and a hollow particle receiver (67) having a receiver flange (69). The left second chamber (61) is mounted by its flanges (63) and (65) to the left branch flange (26) and the receiver flange (69), respectively. The particle receiver (67) has an exhaust port (71), which connects to a vacuum pump (not shown) and the return duct (47A) of the apparatus shown in FIG. 2 for maintaining the desired gas pressure in the system.

The alternative structure shown in FIG. 3 includes also a powder storage container (73) and a tubular vacuum duct (75) connected to the side of the second chamber (61) for slowly feeding the powder into the second chamber (61). The powder is preferably fed into a circular distributor (77) mounted on the inside surface of the second chamber (61). A vibrator (79) is acoustically connected through a linkage (81) to the wall of the second chamber (61) for vibrating the container (73), the duct (75) and the distributor (77) to controllably dispense the powder to cascade through the second chamber at the desired rate.

As the powder cascades through the second chamber (61) the ions and molecular fragments of the plasma combine and condense on the falling particles as a solid insoluble coating. The particles cascade into the receiver (67) where they accumulate and may be removed periodically by switching the plasma flow to a right second chamber and particle receiver (not shown) in a manner similar to that described above with respect to FIG. 2. In the alternative structure, each second chamber has a separate particle receiver, vacuum duct and vacuum pump.

Figure 4:
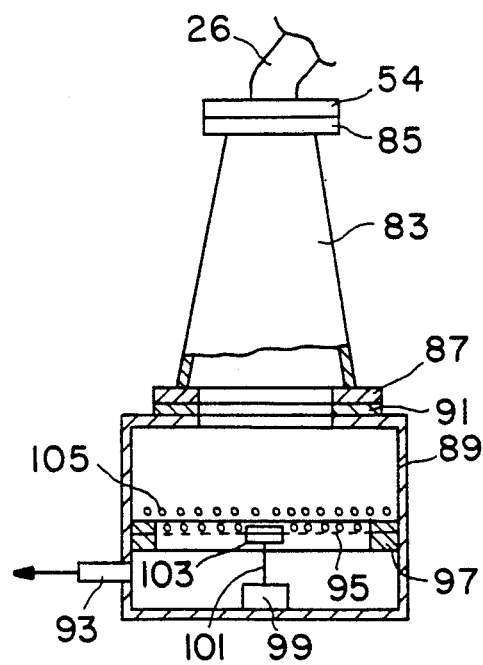
FIG. 4 is an elevational, partially broken-away view of a second alternative plasma condensation/deposition chamber for the apparatus of FIG. 2 wherein the solid reaction product deposits on the particles of a vibrating bed of particles.

FIG. 4 illustrates another alternative second deposition chamber (83) that may be connected to the end flange (54) of the left inlet branch (26) of the apparatus shown in FIG. 2. A similar right second chamber (not shown) may be attached to the end flange (58) of the right inlet branch (28). In the other alternative structure, the solid reaction product deposits on particles in a fluidized bed of particles.

The alternative structure shown in FIG. 4 compresses a hollow conical left second chamber (83) having an upper circular flange (85) at its narrower upper end, a lower circular flange (87) at its wider lower end. The structure includes a hollow particle receiver (89) having a receiver flange (91). The left second chamber (83) is mounted by its upper and lower flanges (85) and (87) to the left branch flange (26) and the receiver flange (91), respectively. The receiver (89) has an exhaust port (93), which connects to a vacuum pump (not shown) and the return duct (47A) of the apparatus shown in FIG. 2 for maintaining the desired gas pressure in the system.

The receiver (89) of the structure shown in FIG. 4 includes also a wire screen (95) supported and held taut between a pair of clamps (97) attached to the inner walls of the receiver (89). A vibrator (99) is acoustically connected to the center of the screen (95) through a linkage (101) and a connector (103) in a manner to provide vertical movement of the screen (95). A bed (105) of powder particles resides on the upper surface. The vibration of the screen (95) from the vibrator (99) keeps the particles in the bed fluidized, whereby the solid reaction product resulting from the combining of the constituents of the plasma can recombine on the surfaces of the particles as it is drawn through the bed (105). The bed (105) of particles may be removed and a new bed installed periodically by switching the plasma flow to a right second chamber and particle receiver (not shown) in a manner similar to that described above with respect to FIG. 3.

In the alternative arrangement where the reaction product is deposited on particles, the particles are preferably insoluble, refractory, low in cost and readily available in a range of particle sizes. Also, the reaction product should have an affinity for the surfaces of the particles so that the reaction product will tend to deposit thereon. There may be a single composition or a combination of different compositions of particles, which may be one or more of the following, for example: alumina, quartz, graphite, feldspar, talc, mica, bremalite, magnetite, calcium carbonate, calcium sulfate, gloss flakes, gloss fibers and rutile. In some cases, the particles may be reactive with the plasma to form insoluble reaction products.

What is claimed is:

1. A process for cold plasma enhanced treatment of a waste stream containing a gas or a vaporizable material selected from the group consisting of organic compounds, organo-metallic compounds, a mixture of organic compounds, a mixture of organo-metallic compounds, so as to convert said material and mixtures of organic and organo-metallic compounds, into a non-leachable, essentially inert, non-toxic solid said process comprising:

providing a reactor having at least two (2) functionally-distinct chambers including a first chamber for subjecting said gas or vaporizable material to a high energy density electric field adapted to convert said material to a cold plasma and a second chamber adapted for recombining of the components of said cold plasma into a non-leachable, essentially inert, non-toxic solid reaction product, said high energy density electric field being generated by an energy source is inductively coupled to said first chamber;

introducing a gaseous stream containing said gas or vaporizable material into said first chamber of said reactor at a pressure sufficient to effect transport of said stream from said first chamber to said second chamber;

subjecting said gaseous stream in said first chamber to the high energy density electric field under cold plasma conditions for an interval sufficient to effect essentially complete dissociation of said gas or vaporizable material into the cold plasma consisting essentially of free radicals, electrons, ions, and generation of radiation in the ultraviolet and near-ultraviolet regions of the electromagnetic spectrum and, subjecting said plasma to a magnetic field so as to control the recombination and deposition of the components of the cold plasma within the high energy density electric field of the chamber of said reactor and during the transport thereof from said first chamber to the second chamber of said reactor, and thereby inhibit recombination and deposition of the components of the cold plasma within said first chamber; and forming a solid in said second chamber from the components of the cold plasma.

2. The process of claim 1, wherein the high energy density electric field is generated by an energy source operated at a frequency in the range of from about 100 megahertz to 2.45 gigahertz, and at a power level in excess of about ten (10) Watts to five thousand (5,000) Watts.

3. The process of claim 1, wherein the high energy density electric field is generated by an energy source which is inductively coupled to said first chamber, having a power output in the range of from about fifteen (15) to five-thousand (5,000) Watts.

4. The process of claim 1, wherein the magnetic field control of the plasma within said first chamber, inhibits recombination and/or deposition of the components of the plasma within said first chamber.

5. The process of claim 1, including transporting the plasma from said first chamber to said second chamber where the components thereof combine to form a non-leachable, essentially inert, nontoxic solid material or coating.

6. The process of claim 5, wherein the plasma combines to form a solid coating upon the surface of a said second chamber.

7. The process of claim 5, wherein the plasma combines upon particulate matter that is suspended within said second chamber of the reactor.

8. The process of claim 5, wherein the temperature in said second chamber of the reactor is biased to favor deposition of the components of the plasma within said second chamber.

9. The process of claim 8, wherein the temperature in said second chamber of the reactor is less than the temperature of the first chamber of the reactor.

10. The process of claim 5, wherein the components of the plasma recombine as a highly cross-linked matrix which is essentially inert, solid and nontoxic and resistant to solvent extraction.

11. The process of claim 5, wherein any components of the plasma which do not recombine within said second chamber are either trapped or recycled back to the first chamber of the reactor.

12. A process for cold plasma enhanced treatment of a waste stream containing a gas or a vaporizable material selected from the group consisting of organic compounds, organo-metallic compounds, a mixture of organic compounds, so as to convert said material and mixtures of organic and organo-metallic compounds, into a non-leachable, essentially inert non-toxic solid, said process comprising:

providing a reactor having at least two (2) functionally-distinct chambers including a first chamber for subjecting said gas or vaporizable material to a high energy density electric field adapted to convert said material to a cold plasma and a second chamber adapted for recombining of the components of said cold plasma into a non-leachable, essentially inert, non-toxic solid reaction product, said high energy density electric field being generated by an energy source which is inductively coupled to said first chamber, said energy source having a power output in the range of from about ten (10) to about five thousand (5,000) Watts and which is operated at a frequency in the range of from about 100 megahertz to about 2.45 gigahertz;

introducing a gaseous stream containing said gas or vaporizable material into said first chamber of said reactor at a pressure sufficient to effect transport of said stream from said first chamber to said second chamber;

subjecting said gaseous stream in said first chamber to the high energy density electric field under cold plasma conditions for an interval sufficient to effect essentially complete dissociation of said gas or vaporizable material into the cold plasma consisting essentially of free radicals, electrons, ions, and generation of radiation in the ultraviolet and near-ultraviolet regions of the electromagnetic spectrum;

subjecting said cold plasma to a magnetic field so as to control the recombination and deposition of the components of the cold plasma within the high energy density electric field of the first chamber of said reactor and during the transport thereof from said first chamber to the second chamber of said reactor, and thereby inhibit recombination and deposition of the components of the cold plasma within said first chamber, and forming a solid in said second chamber from the components of the cold plasma.

13. A process for converting of a gas or a vaporizable material selected from the group consisting of organic compounds, organo-metallic compounds, a mixture of organic compounds, a mixture of organo-metallic compounds, and mixtures of organic and organo-metallic compounds, into a non-leachable, essentially inert, non-toxic solid material, said process comprising:

providing a reactor having at least two (2) functionally-distinct chambers including a first chamber for subjecting said gas or vaporizable material to a high energy density electric field adapted to convert said material to a cold plasma and a second chamber adapted for recombining of the components of said cold plasma into a non-leachable, essentially inert, non-toxic solid reaction product, said high energy density electric field being generated by an energy source which is inductively coupled to said first chamber, said energy source having a power output in the range of from about ten (10) to about five thousand (5,000) Watts and which is operated at a frequency in the range of from about 100 megahertz to about 2.45 gigahertz;

introducing a gaseous stream containing said gas or vaporizable material into said first chamber of said reactor at a pressure sufficient to effect transport of said stream from said first chamber to said second chamber;

subjecting said gaseous stream in said first chamber to the high energy density electric field under cold plasma conditions for an interval sufficient to effect essentially complete dissociation of said gas or vaporizable material into the cold plasma consisting essentially of free radicals, electrons, ions, and generation of radiation in the ultraviolet and near-ultraviolet regions of the electromagnetic spectrum;

subjecting said cold plasma to a magnetic field so as to control the recombination and deposition of the components of the plasma within the high energy density electric field of the first chamber of said reactor and during the transport thereof from said first chamber to the second chamber of said reactor, and thereby inhibit recombination and deposition of the components of the plasma within said first chamber;

maintaining a temperature bias between said first chamber and said second chamber so as to favor deposition of the components of the plasma within said second chamber; and forming a solid in said second chamber from the components of the cold plasma.

14. In a process for the cold plasma enhanced treatment of waste stream to effect extraction of organic and/or organo-metallic compounds therefrom, the improvement comprising:

providing a reactor having at least two (2) functionally-distinct chambers including a first chamber for subjecting said gas or vaporizable material to a high energy density electric field adapted to convert said material to a cold plasma and a second chamber adapted for recombining of the components of said plasma into a non-leachable, essentially inert, non-toxic solid reaction product, said high energy density electric field being generated by an energy source is inductively coupled to said first chamber;

introducing a gaseous stream containing said gas or vaporizable material into said first chamber of said reactor at a pressure sufficient to effect transport of said stream from said first chamber to said second chamber;

subjecting said gaseous stream in said first chamber to the high energy density electric field under cold plasma conditions for an interval sufficient to effect essentially complete dissociation of said gas or vaporizable material into the cold plasma consisting essentially of free radicals, electrons, ions, and generation of radiation in the ultraviolet and near-ultraviolet regions of the electromagnetic spectrum and, subjecting said cold plasma to a magnetic field so as to control the recombination and deposition of the components of the plasma within the high energy density electric field of the chamber of said reactor and during the transport thereof from said first chamber to the second chamber of said reactor, and thereby inhibit recombination and depositions of the components of the cold plasma within said first chamber; and forming a solid in said second chamber from the components of the cold plasma 15. In a process for the cold plasma enhanced treatment of waste stream to effect extraction of organic and/or organo-metallic compounds therefrom, the improvement comprising:

providing a reactor having at least two (2) functionally-distinct chambers including a first chamber for subjecting said gas or vaporizable material to a high energy density electric field adapted to convert said material to a cold plasma and a second chamber adapted for recombining of the components of said cold plasma into a non-leachable, essentially inert, non-toxic solid reaction product, said high energy density electric field being generated by an energy source which is inductively coupled to said first chamber, said energy source having a power output in the range of from about ten (10) to about five thousand (5,000) Watts and which is operated at a frequency in the range of from about 100 megahertz to about 2.45 gigahertz;

introducing a gaseous stream containing said gas or vaporizable material into said first chamber of said reactor at a pressure sufficient to effect transport of said stream from said first chamber to said second chamber;

subjecting said gaseous stream in said first chamber to the high energy density electric field under cold plasma conditions for an interval sufficient to effect essentially complete dissociation of said gas or vaporizable material into the cold plasma consisting essentially of free radicals, electrons, ions, and generation of radiation in the ultraviolet and near-ultraviolet regions of the electromagnetic spectrum;

subjecting said cold plasma to a magnetic field so as to control the recombination and deposition of the components of the cold plasma within the high energy density electric field of the first chamber of said reactor and during the transport thereof from said first chamber to the second chamber of said reactor, and thereby inhibit recombination and deposition of the components of the cold plasma within said first chamber; and forming a solid in said second chamber from the components of the cold plasma.

16. In a process for the cold plasma enhanced treatment of waste stream to effect extraction of organic and/or organo-metallic compounds therefrom, the improvement comprising:

providing a reactor having at least two (2) functionally-distinct chambers including a first chamber for subjecting said gas or vaporizable material to a high energy density electric field adapted to convert said material to a cold plasma and a second chamber adapted for recombining of the components of said cold plasma into a non-leachable, essentially inert, non-toxic solid reaction product, said high energy density electric field being generated by an energy source which is inductively coupled to said first chamber, said energy source having a power output in the range of from about ten (10) to about five thousand (5,000) Watts and which is operated at a frequency in the range of from about 100 megahertz to about 2.45 gigahertz;

introducing a gaseous stream containing said gas or vaporizable material into said first chamber of said reactor at a pressure sufficient to effect transport of said stream from said first chamber to said second chamber;

subjecting said gaseous stream in said first chamber to the high energy density electric field under cold plasma conditions for an interval sufficient to effect essentially complete dissociation of said gas or vaporizable material into the cold plasma consisting essentially of free radicals, electrons, ions, and generation of radiation in the ultraviolet and near-ultraviolet regions of the electromagnetic spectrum;

subjecting said plasma to a magnetic field so as to control the recombination and deposition of the components of the cold plasma within the high energy density electric field of the first chamber of said reactor and during the transport thereof from said first chamber to the second chamber of said reactor, and thereby inhibit recombination and deposition of the components of the plasma within said first chamber;

maintaining a temperature bias between said first chamber and said second chamber so as to favor deposition of the components of the cold plasma within said second chamber; and forming a solid in said second chamber from the components of the cold plasma.

* * * * *